United States Patent
Cho et al.

(10) Patent No.: US 6,414,348 B1
(45) Date of Patent: Jul. 2, 2002

(54) METHOD FOR FABRICATING CAPACITOR IN SEMICONDUCTOR DEVICE

(75) Inventors: Bok Won Cho; Su Jin Seo, both of Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/572,781

(22) Filed: May 17, 2000

(30) Foreign Application Priority Data

Jun. 9, 1999 (KR) .......................................... 99-21421

(51) Int. Cl.⁷ .............................................. H01L 29/72
(52) U.S. Cl. ...................... 257/306; 257/288; 257/310; 438/387; 438/396; 438/762; 438/769; 438/775; 438/785; 438/791
(58) Field of Search ................................ 257/288, 292, 257/306, 310; 438/387, 396, 762, 769, 775, 785, 791

(56) References Cited

U.S. PATENT DOCUMENTS 6,211,035 B1 * 4/2001 Moise et al. ................. 438/396

* cited by examiner

*Primary Examiner*—Edward Wojciechowicz
(74) *Attorney, Agent, or Firm*—Fleshner & Kim, LLP

(57) ABSTRACT

The present invention is directed to a method for fabricating a capacitor in a semiconductor device. The capacitor uses a $Ta_2O_5$ film as a dielectric film. The method for fabrication can include forming a nitride film on a capacitor lower electrode by a rapid thermal nitration process, and depositing the $Ta_2O_5$ film on the nitride film and heat treating using a rapid thermal process including $N_2O$ gas to form an SiON film at an interface between the capacitor lower electrode and the $Ta_2O_5$ film. A capacitor upper electrode is then formed on the $Ta_2O_5$ film. The method according to the present invention can reduce a device deterioration, improve leakage current characteristics and increase a device reliability.

27 Claims, 4 Drawing Sheets

METHOD FOR FABRICATING CAPACITOR IN SEMICONDUCTOR DEVICE

BACKGROUND OF THE INVENTION

1. Field of the Invention

The present invention relates to a method for fabricating a semiconductor device, and more particularly, to a method for fabricating a capacitor in a semiconductor device.

2. Background of the Related Art

In general, as high density device packing is advanced, different methods for stable driving of the device are suggested, such as technology employing tungsten-bitlines or cobalt suicide in case of embedded DRAM. However, the tungsten-bitline limits heat treatment conditions after formation of the tungsten-bitline, and to prevent device deterioration, the heat treatment after the bitline formation is limited to be carried out at 800° C. within 10 min.

A related art method for fabricating a capacitor in a semiconductor device will now be described with reference to the attached drawings. FIGS. 1A–1D illustrate cross-sections showing the steps of the related art method for fabricating a capacitor in a semiconductor device.

Referring to FIG. 1A, a plurality of wordlines 13 are formed on a semiconductor substrate 11 with an insulating film 12 inbetween. A first impurity diffusion region 14 and a second impurity diffusion region 14a are formed in the substrate on both sides of each of the wordlines 13. Then, a first insulating layer 15 is formed on the semiconductor substrate 11 inclusive of the wordlines 13 and subjected to photo etching to selectively remove the first insulating layer 15 and form a bitline contact hole 16 that exposes the first impurity region 14. As shown in FIG. 1B, a bitline 17 is formed, which is electrically connected to the first impurity diffusion region 14 through the bitline contact hole 16. The bitline 17 is a stack of layers of titanium (Ti)-titanium nitride (TiN)-tungsten (W) in sequence. A second insulating layer 18 is formed on the first insulating layer 15 inclusive of the bitline 17. The second insulating layer 18 and the first insulating layer 15 are selectively removed by photo etching to form a storage node. contact hole 19 that exposes the second impurity diffusion region 14a.

As shown in FIG. 1C, a conductive material 20 is deposited on the second insulating layer 18 inclusive of the storage node contact hole 19. A planarizing is conducted to stuff the conductive material 20 in the storage node contact hole 19 in electrical connection to the second impurity diffusion region 14a. Then, a material for a capacitor lower electrode is deposited on the second insulating layer 18 inclusive of the conductive material 20 and patterned to form a capacitor lower electrode 21 electrically connected to the conductive material 20. Then, a Rapid Thermal Nitridation (RTN) is conducted at approximately 800° C., to form a nitride film 22 on a surface of the capacitor lower electrode 21 to a thickness of 7~15 Å. Then, a $Ta_2O_5$ film 23 is deposited on the nitride film 22 as a capacitor dielectric film, and subjected to dry-$O_2$ heat treatment in a furnace at an elevated temperature higher than 800° C., to form an SiON film 22a at an interface between the $Ta_2O_5$ film 23 and the capacitor lower electrode 21 as a result of oxidation of the nitride film 22. The SiON film 22a is shown in FIG. 1D. In this instance, a Rapid Thermal Oxidation (RTO) may be employed in place of the dry-$O_2$ heat treatment at an elevated temperature higher than 800° C. The high temperature heat treatment is carried out to improve leakage current characteristics. Then, an upper electrode 24 is formed on the $Ta_2O_5$ film 23 to complete fabrication of the related art capacitor.

As described above, the related art method for fabricating a capacitor in a semiconductor device has various disadvantages. First, as the high density device packing advances, a load on a bitline is increased. When a tungsten-bitline is employed for solving this problem, a heat treatment temperature required for formation of the capacitor is limited. When the $Ta_2O_5$ film 23 is heat treated at a temperature equal to or higher than 800° C. for more than 10 minutes, the tungsten of the bitline is deformed, which causes an increased resistance. Further, an inter-diffusion between the substrate and the bitline increases a bitline resistance. Second, when a capacitor in an embedded DRAM is formed, a dry-$O_2$ process that requires a temperature higher than 800° C. can not be applied in formation of a $Ta_2O_5$ film. Third, RTO may be employed in place of dry-$O_2$ heat treatment. However, RTO requires much more time because diffusion of the oxygen ion is slow.

The above references are incorporated by reference herein where appropriate for appropriate teachings of additional or alternative details, features and/or technical background.

SUMMARY OF THE INVENTION

An object of the present invention is to provide a method for fabricating a capacitor in a semiconductor device that substantially obviates one or more of the problems caused by limitations and disadvantages of the related art and to provide at least the advantages described hereinafter.

Another object of the present invention is to provide a method for fabricating a capacitor in a semiconductor device that decreases or prevents a device deterioration caused by heat treatment.

Another object of the present invention is to provide a method for fabricating a capacitor in a semiconductor device that improves a leakage current characteristic.

Another object of the present invention is to provide a method for manufacturing a capacitor in a semiconductor device that increases device reliability.

To achieve at least these objects and other advantages in a whole or in parts, and in accordance with the purpose of the present invention, as embodied and broadly described, a method for fabricating a capacitor in a semiconductor device includes forming a nitride film on a capacitor lower electrode, depositing a $Ta_2O_5$ film on the nitride film as a capacitor dielectric film, and heat treating by a rapid thermal process using $N_2O$ gas to form an SiON film at an interface between the capacitor lower electrode and the $Ta_2O_5$ film, and forming a capacitor upper electrode on the $Ta_2O_5$ film.

To achieve at least these objects and other advantages in a whole or in parts, and in accordance with the purpose of the present invention, as embodied and broadly described, a method for fabricating a capacitor in a semiconductor device, the capacitor using $Ta_2O_5$ as a dielectric film, the method includes the steps of (a) forming a wordline on a substrate, (b) forming first and second impurity diffusion regions in the substrate on opposite sides of the wordline, respectively, (c) forming a bitline electrically coupled to the first impurity diffusion region, (d) forming a capacitor lower electrode electrically coupled to the second impurity diffusion region, (e) forming a nitride film on a surface of the capacitor lower electrode, (f) depositing a $Ta_2O_5$ film on the nitride film and performing a heat treatment by a rapid thermal process using $N_2O$ gas to form an SiON film at an interface between the capacitor lower electrode and the $Ta_2O_5$ film, and (g) forming a capacitor upper electrode on the $Ta_2O_5$ film.

To achieve at least these objects and other advantages in a whole or in parts, and in accordance with the purpose of the present invention, as embodied and broadly described, a method for fabricating a capacitor in a semiconductor device includes forming a nitride film on a capacitor lower electrode, depositing a $Ta_2O_5$ film on the nitride film, performing a rapid thermal process heat treatment process conducted in the range of approximately 650~750° C. that forms an SiON film at an interface between the capacitor lower electrode and the $Ta_2O_5$ film, and forming a capacitor upper electrode on the $Ta_2O_5$ film.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings. FIGS. 2A~2D are diagrams that illustrate cross-sections showing steps of a method for fabricating a capacitor in a semiconductor device in accordance with a preferred embodiment of the present invention.

Figure 1A:
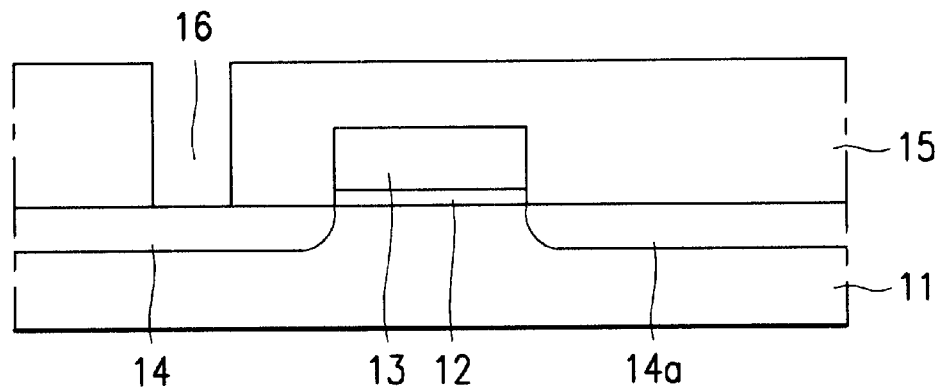
FIGS. 1A~1D illustrate cross-sections showing the steps of a related art method for fabricating a capacitor in a semiconductor device.
Figure 1B:
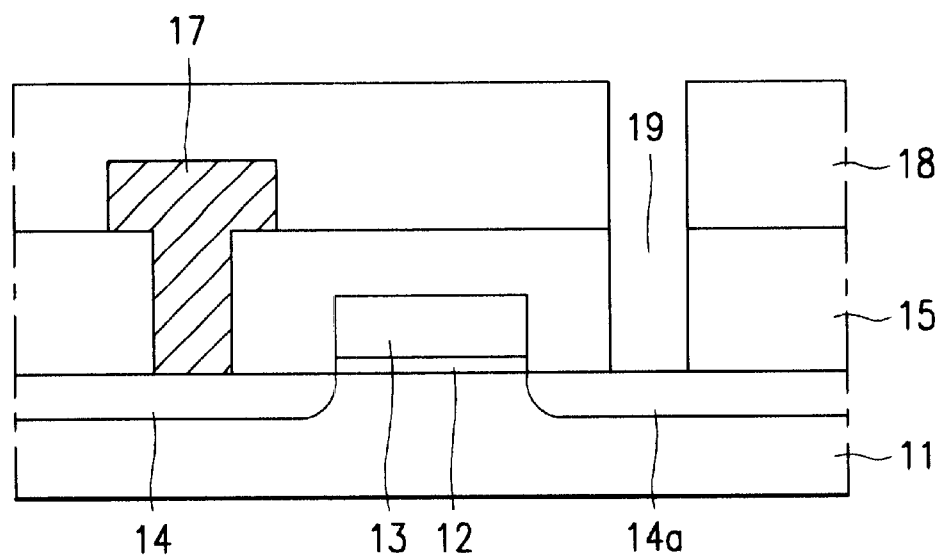
Figure 1C:
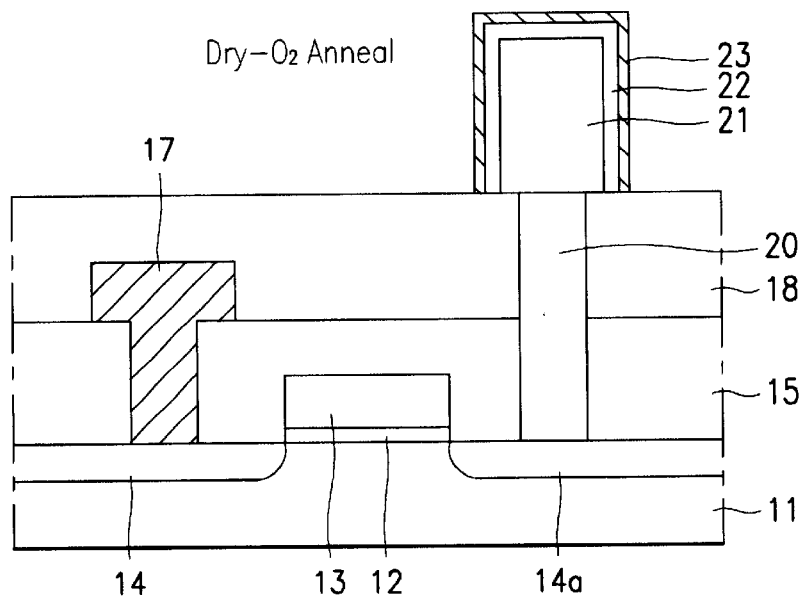
Figure 1D:
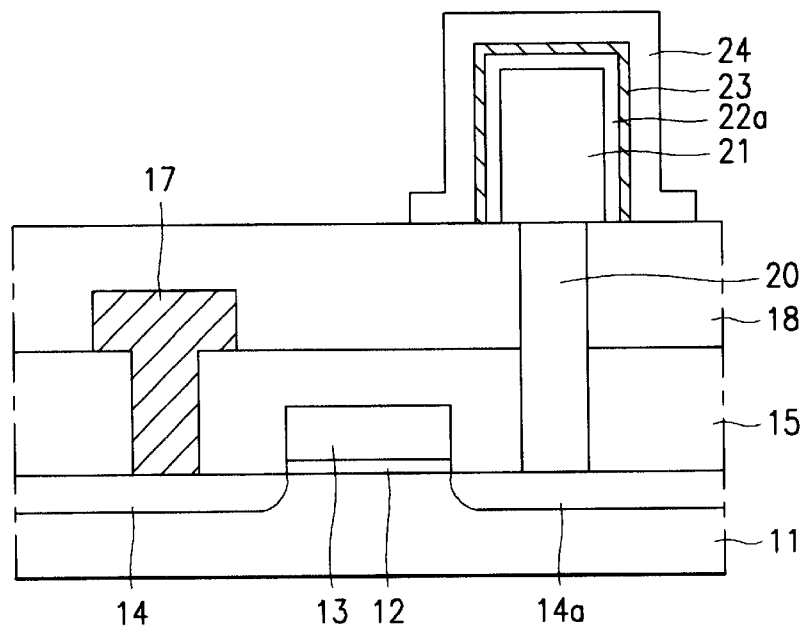
Figure 2A:
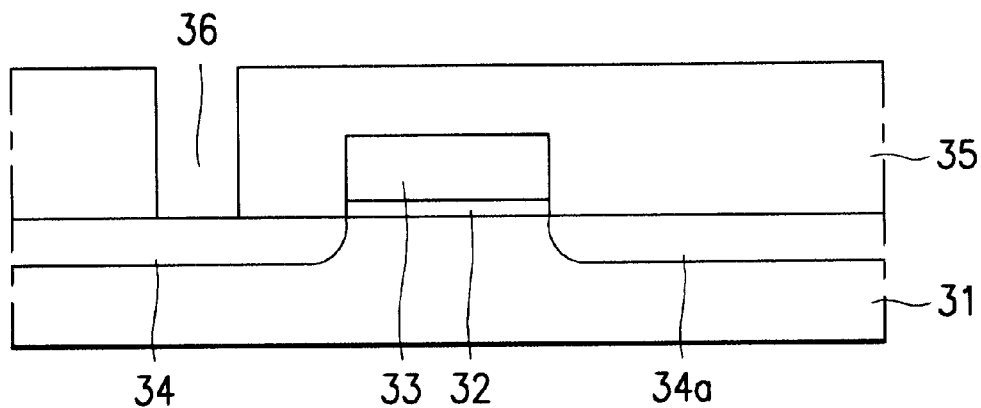
FIGS. 2A~2D are diagrams that illustrate steps of a method for fabricating a capacitor in a semiconductor device in accordance with a preferred embodiment of the present invention.
Figure 2B:
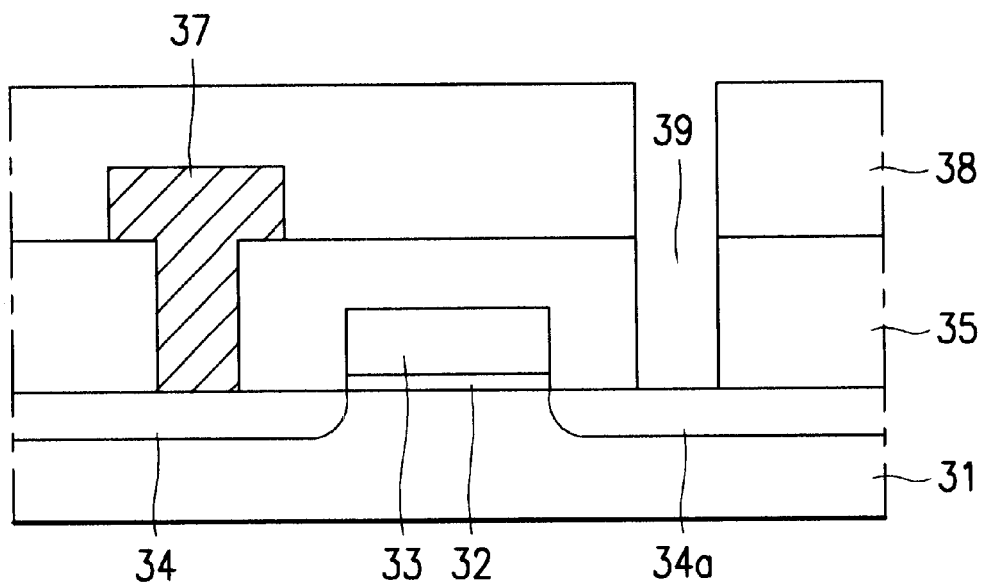

Referring to FIG. 2A, a plurality of wordlines 33 are formed on the semiconductor substrate 31 with an insulating film 32 inbetween. A first impurity region 34 and a second impurity region 34a are formed in surfaces of the semiconductor substrate 31 on both sides of each of the wordlines 33. A first insulating layer 35 is preferably formed on an entire surface of the semiconductor substrate 31 inclusive of the wordlines 33, and is selectively removed, for example by photo etching, to form a bitline contact hole 36 that exposes the first impurity diffusion region 34. As shown in FIG. 2B, a bitline 37 is formed, which is electrically coupled to the first impurity diffusion region 34 through the bitline contact hole 36. The bitline 37 is preferably a stack of layers of titanium (Ti)-titanium nitride (TiN)-tungsten (W) in sequence. As shown in FIG. 2B, a second insulating layer 38 is formed on the first insulating layer 35 inclusive of the bitline 37 and is selectively removed by photo etching or the like with the first insulating layer 35 to expose the second impurity diffusion region 34a to form a storage node contact hole 39.

Figure 2C:
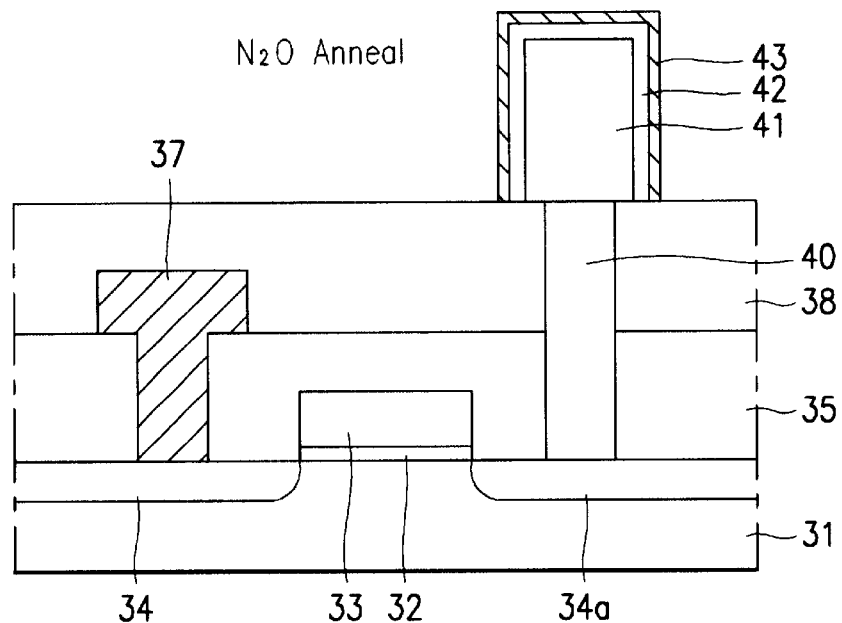
Figure 2D:
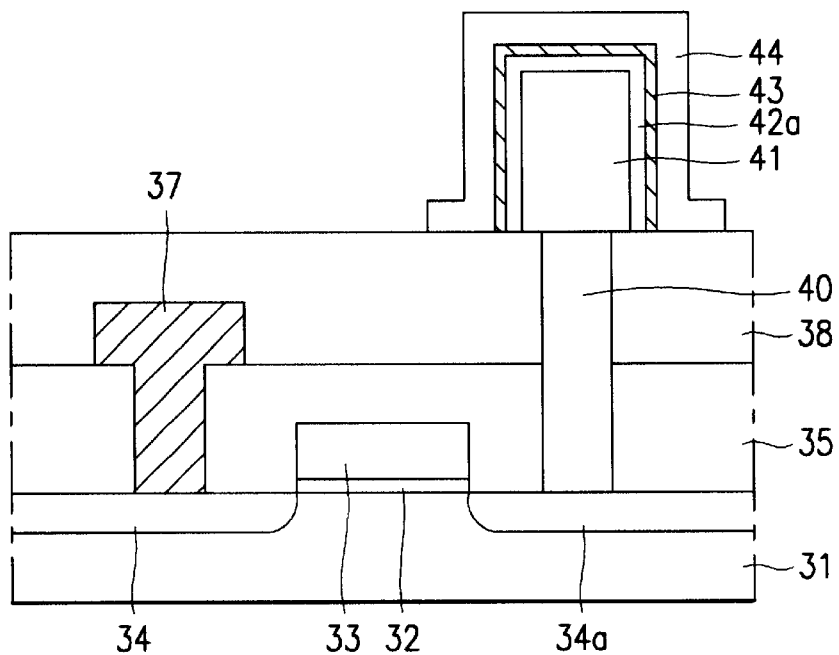

As shown in FIG. 2C, a conductive material 40 is deposited on the second insulating layer 38 inclusive of the storage node contact hole 39. A planarization or the like is performed to fill the conductive material 40 in the storage node contact hole 39, such that the conductive material 40 is electrically coupled or in contact with the second impurity diffusion region 34a. Then, a material for a capacitor lower electrode is deposited on the second insulating layer 38 inclusive of the conductive material 40, and patterned, to form the capacitor lower electrode 41 electrically coupled to the conductive material 40. Then, RTN is preferably used in formation of a nitride film 42 on a surface of the capacitor lower electrode 41 to a thickness of 5~15 Å. Alternatively, in the formation of the nitride film 42, a Low Pressure CVD (LPCVD) may be used. Then, a $Ta_2O_5$ film 43 is formed on the nitride film 42 as a capacitor dielectric film to a required or prescribed thickness. The $Ta_2O_5$ film 43 is preferably formed by CVD. A Rapid Thermal Process (RTP) is conducted at a temperature ranging 700~850° C. for a period not longer than 10 minutes using $N_2O$ gas to oxidize the nitride film 42, which forms an SiON film 42a to a thickness of 10~50 Å at an interface between the capacitor lower electrode 41 and the $Ta_2O_5$ film 43 as shown in FIG. 2D. Preferably, the RTP is performed at a temperature such that the bitline 37 is not negatively effected. Instead of the RTP, a heat treatment by wet oxidation at a temperature ranging 650~750° C. using $H_2$ and $O_2$ gases in an oxidation furnace can also be performed. Alternatively, instead of the wet oxidation, a heat treatment by dry oxidation at a temperature ranging 650~750° C. using a dry-$O_2$ gas in an oxidation furnace can be used. In addition, a heat treatment at a temperature ranging 650~750° C. using UV-$O_3$ or $O_3$ gas can be performed to form the SiON film 42a. Then, a capacitor upper electrode 44 is formed on the $Ta_2O_5$ film 43, to complete fabrication of a capacitor in a semiconductor device of the present invention.

As described above, preferred embodiments of a method for fabricating a capacitor in a semiconductor device of the present invention have various advantages. First, when a heat treatment is conducted using $N_2O$ gas, the heat treatment can be finished in 5 minutes or less. Such a heat treatment time period can prevent deformation of the tungsten, which is used as a bitline material, to improve a device performance and reliability. Further, performing heat treatment using $N_2O$ gas can improve leakage current characteristics of the $Ta_2O_5$ film. In addition, inter-diffusion between the bitline and the substrate will not occur if a heat treatment is performed in a furnace using dry-$O_2$ or wet oxidation at approximately 700° C., which improves a device reliability.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a capacitor in a semiconductor device, comprising:

forming a nitride film on a capacitor lower electrode;

depositing a $Ta_2O_5$ film on the nitride film as a capacitor dielectric film, and heat treating by a rapid thermal process using $N_2O$ gas to form an SiON film at an interface between the capacitor lower electrode and the $Ta_2O_5$ film; and forming a capacitor upper electrode on the $Ta_2O_5$ film.

2. The method of claim 1, wherein the heat treatment is conducted at a temperature ranging approximately 700~850° C., wherein the temperature does not negatively effect bitlines of the semiconductor device.

3. The method of claim 1, wherein the heat treatment is conducted for a period shorter than ten (10) minutes, the nitride film has a thickness of approximately 5 to 15 Å before heat treating, and the SiON film formed by the heat treating has a thickness of approximately 10 to 50 Å at the interface between the capacitor lower electrode and the $Ta_2O_5$ film.

4. The method of claim 1, wherein a portion of the nitride film adjacent to the $Ta_2O_5$ film is oxidized into the SiON film as the heat treatment is proceeded, and wherein the heat treatment is completed within approximately five (5) minutes.

5. The method of claim 1, wherein the heat treatment is conducted by wet oxidation in an oxidation furnace using $H_2$ and $O_2$ gases.

6. The method of claim 5, wherein a temperature in the wet oxidation is in a range of approximately 650~750° C.

7. The method of claim 1, wherein the heat treatment is conducted using at least one of Ultraviolet-zone (UV-$O_3$) and $O_3$ gas.

8. The method of claim 1, wherein the heat treatment is conducted at a temperature ranging 650~750° C.

9. A method for fabricating a capacitor in a semiconductor device, the capacitor using $Ta_2O_5$ as a dielectric film, the method comprising:

forming a wordline on a substrate;

forming first and second impurity diffusion regions in the substrate on opposite sides of the wordline, respectively;

forming a bitline electrically coupled to the first impurity diffusion region;

forming a capacitor lower electrode electrically coupled to the second impurity diffusion region;

forming a nitride film on a surface of the capacitor lower electrode;

depositing a $Ta_2O_5$ film on the nitride film and performing a heat treatment on the nitride film by a rapid thermal process using $N_2O$ gas to form an SiON film at an interface between the capacitor lower electrode and the $Ta_2O_5$ film; and forming a capacitor upper electrode on the $Ta_2O_5$ film.

10. The method of claim 9, wherein the heat treatment is conducted at a temperature ranging 700~850° C., the nitride film has a thickness of approximately 5 to 15 Å before oxidation, and the SiON film has a thickness of approximately 10 to 50 Å at the interface between the capacitor lower electrode and the $Ta_2O_5$ film.

11. The method of claim 9, wherein the heat treatment is conducted for a period shorter than ten (10) minutes, wherein the temperature does not negatively effect bitlines of the semiconductor device.

12. The method of claim 9, wherein the heat treatment is conducted by wet oxidation in an oxidation furnace using $H_2$ and $O_2$ gases.

13. The method of claim 12, wherein a temperature in the wet oxidation is in a range of approximately 650~750° C.

14. The method of claim 9, wherein the heat treatment is conducted using at least one of a UV-$O_3$ gas and an $O_3$ gas.

15. The method of claim 14, wherein the SiON film is formed by oxidizing the nitride film.

16. The method of claim 9, wherein the nitride film is oxidized into SiON during the heat treatment.

17. The method of claim 9, wherein the bitline is a stack of Ti—TiN—W layers, and wherein the nitride film is formed by chemical vapor deposition.

18. A method for fabricating a capacitor in a semiconductor device, comprising:

forming a nitride film on a capacitor lower electrode;

depositing a $Ta_2O_5$ film on the nitride film;

performing a rapid thermal process heat treatment process on the nitride film in the range of approximately 650~750° C. that forms an SiON film from the nitride film at an interface between the capacitor lower electrode and the $Ta_2O_5$ film; and forming a capacitor upper electrode on the $Ta_2O_5$ film.

19. The method of claim 18, wherein the heat treatment uses $N_2O$ gas for a period less than ten (10) minutes.

20. The method of claim 18, wherein the heat treatment is one of performed using wet oxidation in an oxidation furnace using $H_2$ and $O_2$ gases and performed using at least one of an UV-$O_3$ gas and an $O_3$ gas.

21. The method of claim 1, wherein the rapid thermal processing using $N_2O$ gas oxidizes the nitride film.

22. The method of claim 1, wherein the nitride film and the $Ta_2O_5$ film are concurrently subjected to the rapid thermal process in the $N_2O$ gas and are concurrently oxidized to form an SiON film from the nitride film where the nitride film is located between the $Ta_2O_5$ film and the capacitor upper electrode white the nitride layer is oxidized.

23. The method of claim 9, wherein the heat treatment does not deform the bitline and is conducted at a temperature in the approximate range of 650~750° C.

24. The method of claim 9, wherein the rapid thermal processing using $N_2O$ gas oxidizes the nitride film.

25. The method of claim 9, wherein the nitride film and the $Ta_2O_5$ film are concurrently subjected to the rapid thermal process in the $N_2O$ gas and are concurrently oxidized to form an SiON film from the nitride film where the nitride film is located between the $Ta_2O_5$ film and the capacitor upper electrode while the nitride layer is oxidized.

26. The method of claim 18, wherein the rapid thermal processing using $N_2O$ gas oxidizes the nitride film.

27. The method of claim 18, wherein the nitride film and the $Ta_2O_5$ film are concurrently subjected to the rapid thermal process in the $N_2O$ gas and are concurrently oxidized to form an SiON film from the nitride film, and wherein the nitride film is located between the $Ta_2O_5$ film and the capacitor upper electrode while the nitride layer is oxidized.

* * * * *